United States Patent
Park

(10) Patent No.: US 8,530,901 B2
(45) Date of Patent: Sep. 10, 2013

(54) FILM TRANSISTOR AND METHOD FOR FABRICATING THE SAME

(75) Inventor: Jae Bum Park, Seoul (KR)

(73) Assignee: LG Display Co., Ltd., Seoul (KR)

( * ) Notice: Subject to any disclaimer, the term of this patent is extended or adjusted under 35 U.S.C. 154(b) by 220 days.

(21) Appl. No.: 13/096,657

(22) Filed: Apr. 28, 2011

(65) Prior Publication Data

US 2011/0198604 A1    Aug. 18, 2011

Related U.S. Application Data

(62) Division of application No. 11/540,155, filed on Sep. 29, 2006, now Pat. No. 7,960,295.

(30) Foreign Application Priority Data

Mar. 10, 2006 (KR) .......................... 10-2006-0022625

(51) Int. Cl.
*H01L 29/04* (2006.01)

(52) U.S. Cl.
USPC .. 257/75; 257/40; 257/E21.297; 257/E21.299

(58) Field of Classification Search
USPC ................... 257/E21.028, E21.254, E21.297, 257/E21.299, E21.492, E21.497
See application file for complete search history.

(56) References Cited

U.S. PATENT DOCUMENTS

| 6,162,667 A | 12/2000 | Funai et al. |
| 2001/0053840 A1 | 12/2001 | Ko et al. |
| 2002/0190416 A1 | 12/2002 | Birch et al. |
| 2005/0074963 A1 | 4/2005 | Fujii et al. |
| 2005/0181547 A1* | 8/2005 | Asano et al. ................... 438/149 |

* cited by examiner

*Primary Examiner* — Cheung Lee
(74) *Attorney, Agent, or Firm* — Brinks Hofer Gilson & Lione

(57) ABSTRACT

A method for fabricating a thin film transistor and a thin film transistor includes a polycrystalline silicon layer formed by irradiating an amorphous silicon layer with a laser beam through an organic layer formed on the amorphous silicon layer and removing the organic layer.

10 Claims, 4 Drawing Sheets

US 8,530,901 B2

FILM TRANSISTOR AND METHOD FOR FABRICATING THE SAME

The present patent document is a divisional of U.S. patent application Ser. No. 11/540,155, filed Sep. 29, 2006, now U.S. Pat. No. 7,960,295 which claims priority to Korean Patent Application No. 10-2006-022625 filed in Korea on Mar. 10, 2006, which is hereby incorporated by reference.

BACKGROUND

1. Field of the Invention

The present invention relates to a thin film transistor (TFT) and a method for fabricating the same.

2. Discussion of the Related Art

Flat panel displays are noted because of their light weight, thin structure and low power consumption. Examples of flat panel displays having higher image quality include a liquid crystal display (LCD) and an organic light emitting display (OLED).

The flat panel displays may use a thin film transistor (TFT) as a switching device. A semiconductor layer of the TFT comprises amorphous silicon or polycrystalline silicon.

In comparison to amorphous silicon, polycrystalline silicon has superior field effect mobility, response time and stability of temperature and light. The TFT including the semiconductor layer composed of polycrystalline silicon has an advantage in that it is possible to form the TFT and the driving integrated circuit (IC) on the same substrate. There is no need for the TFT to be connected to the driving IC.

The semiconductor layer composed of the polycrystalline silicon may be formed by depositing the polycrystalline silicon or by crystallizing an amorphous silicon layer after deposition. There are many methods of crystallization, for example, Solid Phase Crystallization (SPC), Metal Induced Crystallization (MIC), Eximer Laser Annealing (ELA) and Sequential Lateral Solidification (SLS), and the like.

ELA is a representative method to crystallize the amorphous silicon. Crystallization by ELA is performed by irradiating the amorphous silicon layer with a laser beam, such as XeCl laser, having a wavelength of about 308 nm. Use of ELA is very common because crystallization by ELA results in lower thermal impact on the glass substrate and a polycrystalline silicon layer crystallized by ELA has superior properties as compared to a polycrystalline silicon layer crystallized by other methods.

FIG. 1A is a cross-sectional schematic view showing a polycrystalline silicon layer crystallized by ELA, and FIG. 1B is a photograph of the surface of a polycrystalline silicon layer crystallized by ELA.

Referring to FIGS. 1A and 1B, the polycrystalline silicon layer 120 has protrusions C formed in the grain boundary region B between adjacent grains A. The protrusions C are generated because of a difference in the density of adjacent grains that occurs when the amorphous silicon is rapidly crystallized after being melted.

The polycrystalline silicon layer 120 has inferior surface uniformity and a gate insulating layer subsequently formed with the polycrystalline silicon layer 120 will also have inferior surface uniformity. The inferior surface uniformity causes leakage current in the TFT and hillocks in the metal layer subsequently formed overlying the gate insulating layer on the gate electrode. Moreover, the protrusions C cause incorrect exposure and etching in the photolithography process used to pattern the metal layers, thereby degrading the properties of TFT and decreasing its reliability.

BRIEF SUMMARY

In one aspect, a method for fabricating a thin film transistor includes forming an amorphous silicon layer on a substrate and forming an organic layer on the amorphous silicon layer. The method further includes forming polycrystalline silicon by irradiating the amorphous silicon layer with a laser beam through the organic layer to form a polycrystalline silicon layer and removing the organic layer.

In another aspect, a thin film transistor includes a semiconductor layer including polycrystalline silicon and a source region, a drain region and a channel region where the polycrystalline silicon is crystallized by irradiating an amorphous silicon layer with laser beam through an organic layer removeably disposed on the amorphous silicon layer. The transistor further includes a gate electrode in spaced relationship to the channel region, a gate insulating layer between the gate electrode and the semiconductor layer, where an interface between the gate insulating layer and the semiconductor layer is substantially free of protrusions. A source electrode and a drain electrode are electrically connected to the source region and the drain region, respectively.

In yet another aspect, a method for fabricating a semiconductor layer in a thin film transistor includes forming an amorphous silicon layer and forming an organic layer comprising a silane group on the amorphous silicon layer. The amorphous silicon layer is laser irradiated through the self assembly monolayer and the self assembly monolayer is removed.

In a further aspect, an intermediate process phase of thin film transistor includes a semiconductor layer including amorphous silicon having a surface. An organic layer is removeably disposed on the surface of the amorphous silicon layer and includes a silane group bonded to the surface. The amorphous silicon layer is configured to be crystallized by irradiating an amorphous silicon layer with a laser beam through the organic layer to transform the amorphous silicon layer to polycrystalline silicon.

DETAILED DESCRIPTION OF THE DRAWINGS AND THE PRESENTLY PREFERRED EMBODIMENTS

Figure 1A:
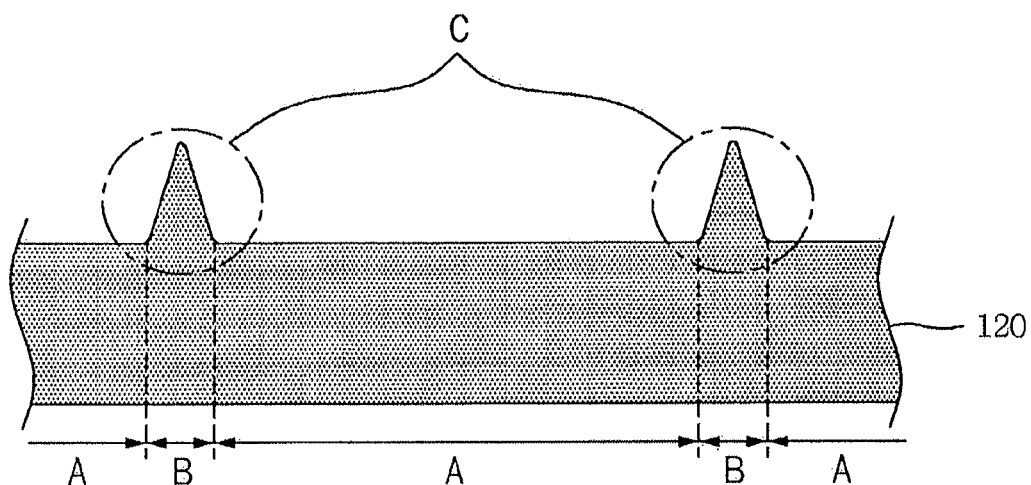
FIG. 1A is a cross-sectional view of the polycrystalline silicon layer according to the related art.
Figure 1B:
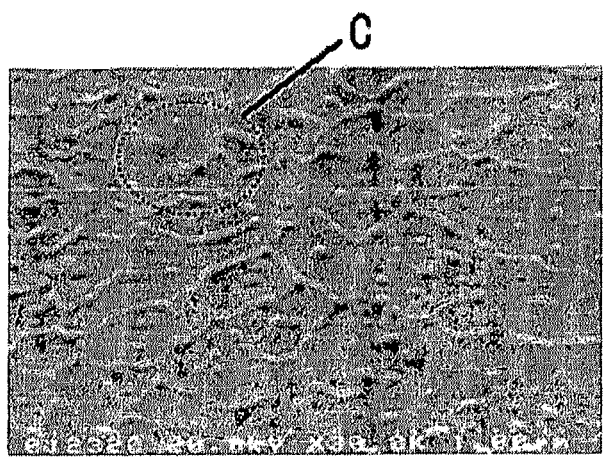
FIG. 1B is a photograph of the surface of the polycrystalline silicon layer according to the related art.

An embodiment will be described with reference to the accompanying drawings. However, the present invention is not limited to one embodiment described below, but may be embodied in a variety of forms. In the drawings, if it is mentioned that a layer is positioned on a different layer or a substrate, the layer may be formed directly on the different layer or the substrate, or another layer may be interposed therebetween. Like reference numerals designate like elements.

Figure 2:
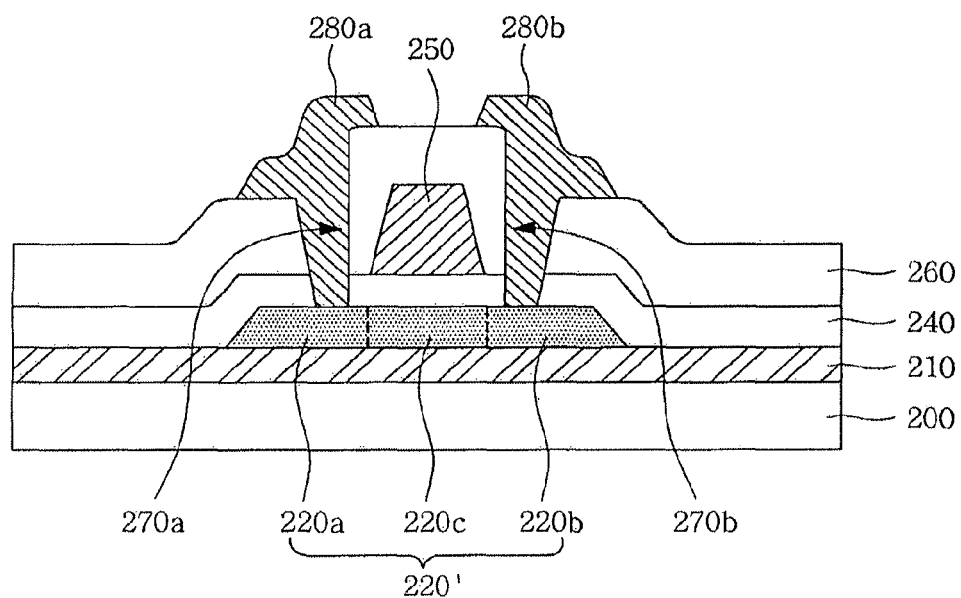
FIG. 2 is a cross-sectional view showing the structure of a thin film transistor according to an embodiment of the present invention.

FIG. 2 is a cross-sectional view showing the structure of the thin film transistor according to an embodiment.

Referring to FIG. 2, the TFT according to an embodiment includes a substrate 200, a buffered layer 210 disposed on the substrate, and a semiconductor layer 220 including polycrystalline silicon disposed on the buffered layer 210. A source region 220a, a drain region 220b, and a channel region 220c reside in the semiconductor layer 220, and a gate insulating layer 240 is disposed on the semiconductor layer 220. A gate electrode 250 is disposed on the gate insulating layer 240 corresponding to the channel region 220c. An inter-insulating layer 260 is disposed on the gate electrode 250, and a source electrode 280a and a drain electrode 280b are disposed on the inter-insulating layer 260. The source electrode 280a and the drain electrode 280b may be electrically connected to the source region 220a and the drain region 220b through contact holes 270a and 270b disposed in the inter-insulating layer 260 and the gate insulating layer, which expose portions of the source region 220a and the drain region 220b.

In accordance with the illustrated embodiment, the semiconductor layer 220 includes polycrystalline silicon crystallized by irradiating an amorphous silicon layer with a laser beam through an organic layer after sequentially stacking the amorphous silicon layer and the organic layer on the substrate.

Those skilled in the art will readily appreciate that a TFT arranged in accordance with the invention can be configured as a top gate device or a bottom gate device. In an embodiment, although the TFT is a top gate TFT, it is also possible for the TFT to be formed as a bottom gate TFT including a gate electrode, a gate insulating layer, a semiconductor layer, a source electrode and a drain electrode sequentially stacked on the substrate.

Now, a method of fabricating a thin film transistor according to an embodiment will be described with reference to the accompanying drawings.

FIGS. 3A to 3D are cross-sectional views illustrating a method of fabricating the TFT according to an embodiment.

Figure 3A:
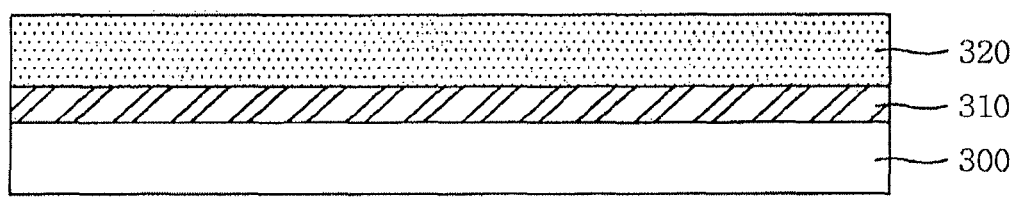
FIGS. 3A to 3D are cross-sectional views of process steps for fabricating the TFT according to an embodiment of the present invention.

Referring to FIG. 3A, a buffered layer 310 is formed on a substrate 300. The buffered layer is formed selectively to protect the TFT from impurities such as alkali ions diffused from the glass substrate. The buffered layer 310 may be composed of silicon oxide (SiO2) or silicon nitride (SiNx).

An amorphous silicon layer 320 is formed on the buffered layer 310. The amorphous silicon layer 320 may be formed by Plasma Enhanced Chemical Vapor Deposition (PECVD) or Low Pressure Chemical Vapor Deposition (LPCVD).

Figure 3B:
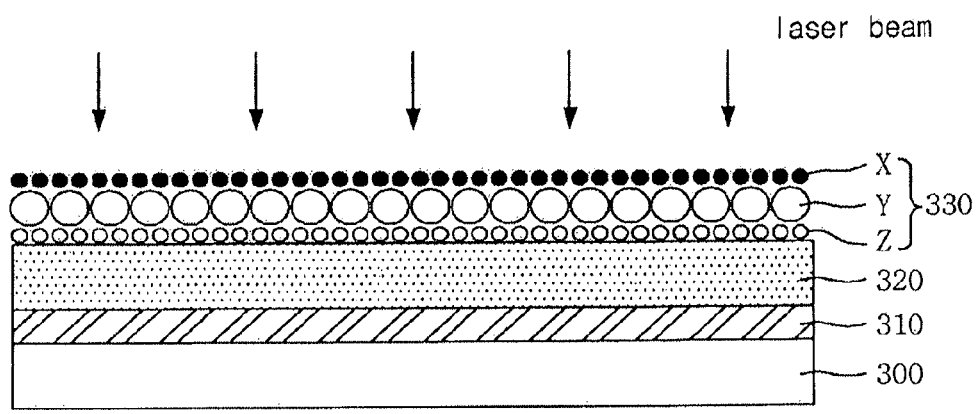

Referring to FIG. 3B, an organic layer 330 is formed on the amorphous silicon layer 320, and then the amorphous silicon layer 320 is crystallized by being irradiated with laser beam having the wavelength of about 308 nm through the organic layer 330.

The organic layer 330 may be a self assembly monolayer (SAM) including a silane group. The SAM is formed by the spontaneous organization of materials through noncovalent interactions with no external intervention and includes certain active molecules to chemically bond with the surface of a given substrate. In an embodiment, the active molecules may be a silane group. The SAM including a silane group may be formed by coating a solution of mixed materials including a silane group on the substrate and then treating it thermally.

A representative chemical formula of the SAM 330 is X—Y—Z where, X is H or CH3, Y is C4 to C50 of a linear or a branched chain, and Z is a silane group including halogen element, for example, —SiCl(CH3)2, —SiCl2CH3, —SiCl3, —SiI3, and the like.

Crystallization using ELA is performed in a $N_2$ atmosphere. When irradiating the amorphous silicon layer with a laser beam, grains are produced as the amorphous silicon layer passes from a liquid to a solid state. Then, the amorphous silicon becomes polycrystalline silicon. When a difference in density occurs when producing the grains from the melted amorphous silicon, a grain boundary region that has higher energy is formed between the grains. Protrusions occur on the surface region corresponding to the grain boundary because silicon atoms on the surface of the grain boundary may easily bond with the oxygen existing in the crystallization chamber.

To prevent the protrusions, the SAM is formed on the amorphous silicon layer 320 prior to irradiating the amorphous silicon layer 320 with the laser beam in an embodiment.

The SAM has a firm structure and a strong surface due to the presence of C4 to C50 linear or branched carbon chains. Therefore, when the amorphous silicon layer is irradiated with the laser beam through the SAM, the SAM may maintain its structure.

The silane group including the halogen element of the SAM bonds with the silicon atoms in the surface of the amorphous silicon layer 320. The halogen element easily bonds with the silicon compared with oxygen, so it is possible to prevent bonding between the silicon atom on the surface of the amorphous silicon layer and the oxygen present in the chamber during the crystallization by ELA. As a result, the production of the protrusions may decrease and the uniformity of the crystallized layer 320 may improve.

The thickness of the organic layer 330 may be 1 nm to 10 nm, the thickness of the organic layer may be determined according to the number of carbons in the "Y" component of the SAM. If the thickness of the organic layer 330 is more than about 1 nm, it is possible to protect the amorphous silicon layer 320 from oxygen and if the thickness of the organic layer 330 is less than about 10 nm, it is possible for the laser to penetrate through the organic layer to improve the efficiency of the crystallization. In an embodiment, the organic layer is octadecyltrichlorosilane (OTS) or monoalkyltrichlorosilane (MTS).

After the crystallization process is complete, the organic layer 330 is irradiated with UV light having a wavelength of 180-260 nm to break the bonding between the surface of silicon layer 320 and the organic layer 330. Then, the organic layer 330 is removed by washing with alcohol or water.

Figure 3C:
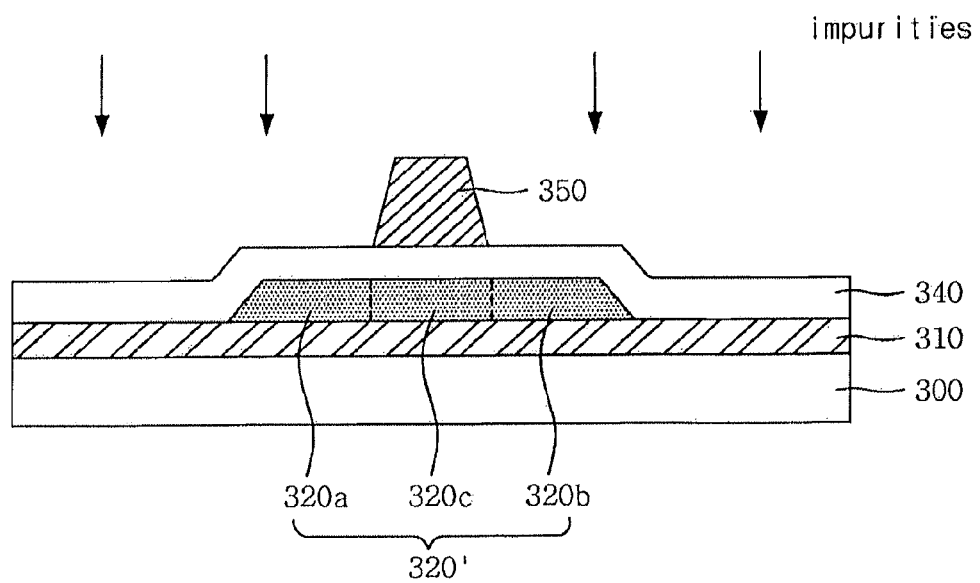

Referring to FIG. 3C, a semiconductor layer 320 is formed by patterning the crystallized layer of polycrystalline silicon using photolithography and an etching process. A gate insulating layer 340 is then formed on the semiconductor layer 320. The gate insulating layer 340 is preferably silicon oxide or silicon nitride.

A gate electrode 350 is formed on the gate insulating layer 340 corresponding to the region of the semiconductor layer 320. In accordance with an embodiment of the invention, the gate electrode 350 formed from a metal such as Al, an Al alloy, Mo, a Mo alloy, and the like.

A source region 320A, a drain region 320b and a channel region 320c are defined by doping impurities in the semiconductor layer 320' using the gate electrode 350 as a mask.

Figure 3D:
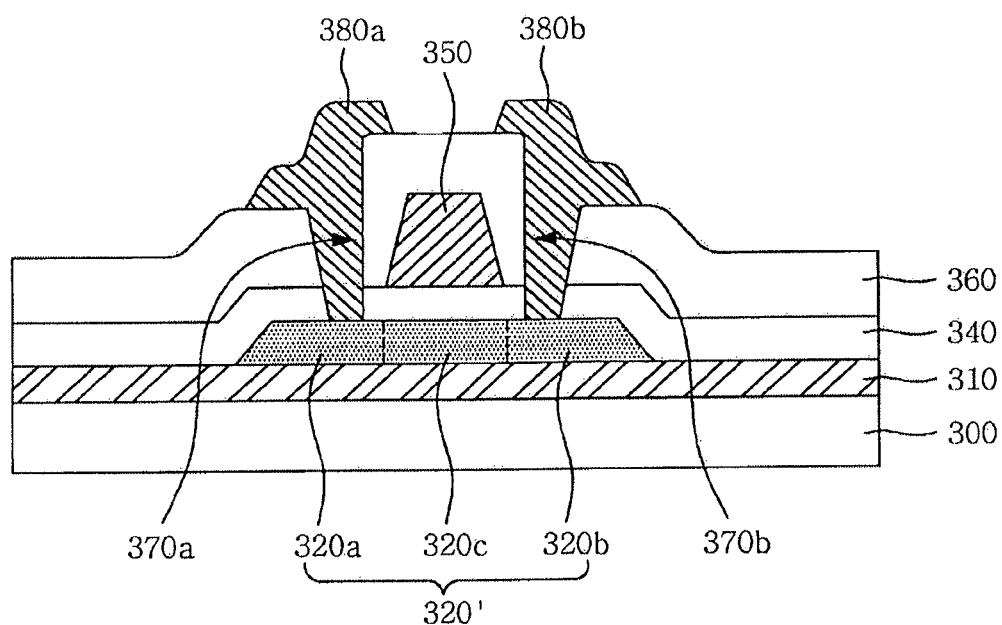

Referring to FIG. 3D, an inter-insulating layer 360 is formed on the substrate including the gate electrode 350 for providing insulation. The inter-insulating layer 360 includes silicon nitride or silicon oxide.

Contact holes 370a and 370b are formed in the inter-insulating layer 360 and the gate insulating layer 340 by etching portions of the inter-insulating layer 360 and the gate insulating layer 340. The contact holes 370a and 370b expose portions of the source region and the drain region 320b and 320c, respectively.

A source electrode and a drain electrode 380a and 380b, respectively, are formed on the inter-insulating layer 360. The source electrode 380a and the drain electrode 380b may be electrically connected to the source region and the drain region 320a and 320b through the respective contact holes 370a and 370b. The source electrode and the drain electrode 380a and 380b include metals having low resistance, for example, Mo, W, MoW, Al, and the like.

Through the process described above, the TFT including the semiconductor layer 320', the gate insulating layer 340, the gate electrode 350, the source electrode 370a and the drain electrode 370b may be prepared.

Although the process has not been illustrated herein, a flat panel device may be prepared by forming a passivation or a planarization layer, or both, on the TFT and a first electrode connected to the drain electrode on the passivation or the planarization layer. A second electrode is formed opposing the first electrode and a liquid crystal layer or an organic emitting layer interposed between both the electrodes.

As described above, prior to crystallization of the amorphous silicon layer, the organic layer is formed on the amorphous silicon layer to prevent the production of protrusions by oxidizing the surface of the amorphous silicon layer, especially the surface corresponding to the grain boundary during the crystallization by ELA. Therefore, the uniformity of the surface of the semiconductor layer improves. As a result, the reliability of the TFT improves.

In one aspect, the present invention advantageously decreases the leakage current of the gate insulating layer and improves the properties and the reliability of the TFT. Although the present invention has been described with reference to certain exemplary embodiments, it will be understood by those skilled in the art that a variety of modifications and variations may be made to the present invention without departing from the spirit or scope of the present invention defined in the appended claims, and their equivalents.

The invention claimed is:

1. A thin film transistor comprising:
   a semiconductor layer comprising polycrystalline silicon and including a source region, a drain region and a channel region, wherein the polycrystalline silicon is crystallized by irradiating an amorphous silicon layer with a laser beam through an organic layer disposed on the amorphous silicon layer,
   a gate electrode in spaced relationship to the channel region;
   a gate insulating layer between the gate electrode and the semiconductor layer,
   wherein an interface between the gate insulating layer and the semiconductor layer is substantially free of protrusions; and
   a source electrode and a drain electrode electrically connected to the source region and the drain region, respectively,
   wherein the organic layer comprises a material represented by the formula X—Y—Z, wherein X is H or CH3, Y is C4 to C50 of a linear or a branched chain, and Z is a silane group which comprises at least a halogen element.

2. The thin film transistor of claim 1, wherein the silane group comprises a $SiI_3$ group.

3. The thin film transistor of claim 1, wherein the organic layer comprises monoalkyltrichlorosilane (MTS).

4. The thin film transistor of claim 1, wherein the organic layer has a thickness of about 1 nm to about 10 nm.

5. The thin film transistor of claim 1, wherein the organic layer comprises a material configured to be removed after irradiating the amorphous silicon layer with a laser beam.

6. The thin film transistor of claim 5, wherein the organic layer comprises a material configured to be removed by irradiation with UV and washing with one of alcohol or water.

7. The thin film transistor of claim 1, wherein the thin film transistor comprises a top gate thin film transistor, wherein the gate insulating layer, the gate electrode, and the source and drain electrodes are sequentially staked on the semiconductor layer, and wherein an inter-insulating layer is interposed between the gate electrode and the source and drain electrodes.

8. The thin film transistor of claim 1, wherein the thin film transistor comprises a bottom-gate thin film transistor, wherein the gate insulating layer, the semiconductor layer, the source and drain electrodes are sequentially stacked on the gate electrode.

9. An intermediate process phase of thin film transistor comprising:
   a semiconductor layer comprising amorphous silicon having a surface; and
   an organic layer disposed on the surface of the amorphous silicon layer and including a silane group bonded to the surface;
   wherein the amorphous silicon layer is configured to be crystallized by irradiating an amorphous silicon layer with a laser beam through the organic layer to transform the amorphous silicon layer to polycrystalline silicon,
   wherein the organic layer comprises a material represented by the formula X—Y—Z, wherein X is H or CH3, Y is C4 to C50 of a linear or a branched chain, and Z is a silane group which comprises at least a halogen element.

10. The thin film transistor of claim 9, wherein the organic layer comprises a self assembly monolayer including a halogenated silane group bonded to the surface of the amorphous silicon layer.

* * * * *